United States Patent [19]

MacDonald et al.

[11] Patent Number: 5,253,354
[45] Date of Patent: Oct. 12, 1993

[54] ROW ADDRESS GENERATOR FOR DEFECTIVE DRAMS INCLUDING AN UPPER AND LOWER MEMORY DEVICE

[75] Inventors: James R. MacDonald; Romi Bose, both of Austin, Tex.

[73] Assignee: Advanced Micro Devices, Inc., Sunnyvale, Calif.

[21] Appl. No.: 576,008

[22] Filed: Aug. 31, 1990

[51] Int. Cl.$^5$ .............................................. G06F 12/02
[52] U.S. Cl. .................... 395/425; 395/400; 364/243.1; 364/245.3; 364/246.4
[58] Field of Search ............... 395/400, 425; 364/200 MS File, 900 MS File

[56] References Cited

U.S. PATENT DOCUMENTS

| | | | |
|---|---|---|---|
| 3,796,996 | 3/1974 | Curley et al. | 395/425 |
| 3,806,881 | 4/1974 | Miwa et al. | 395/400 |
| 4,234,934 | 11/1980 | Thorsrud | 395/400 |
| 4,254,463 | 3/1981 | Busby et al. | 395/400 |
| 4,424,561 | 1/1984 | Stanley et al. | 395/425 |
| 4,527,251 | 7/1985 | Nibby, Jr. et al. | 395/400 |
| 4,860,252 | 8/1989 | Sykora | 395/400 |
| 4,903,197 | 2/1990 | Wallace et al. | 395/425 |
| 5,051,994 | 9/1991 | Bluethman et al. | 371/11.1 |
| 5,146,581 | 9/1992 | Kaneko | 395/425 |

*Primary Examiner*—Joseph L. Dixon
*Assistant Examiner*—Hiep T. Nguyen
*Attorney, Agent, or Firm*—Foley & Lardner

[57] ABSTRACT

A row address generator permits defective dynamic random access memory devices to be addressed by forcing the most-significant bit of the row address to a logical one if the upper half of the defective DRAM is operative and the lower half is inoperative and by forcing the most-significant bit of the row address to a logical zero if the lower half of the DRAM is operative and the upper half is inoperative. A configuration register provides a control signal indicative of the half of the defective DRAM which is operative and a memory access detector provides an access control signal when the defective DRAM device is addressed. A row address control forces the most-significant bit to the proper level responsive to the configuration register and the memory access detector.

18 Claims, 1 Drawing Sheet

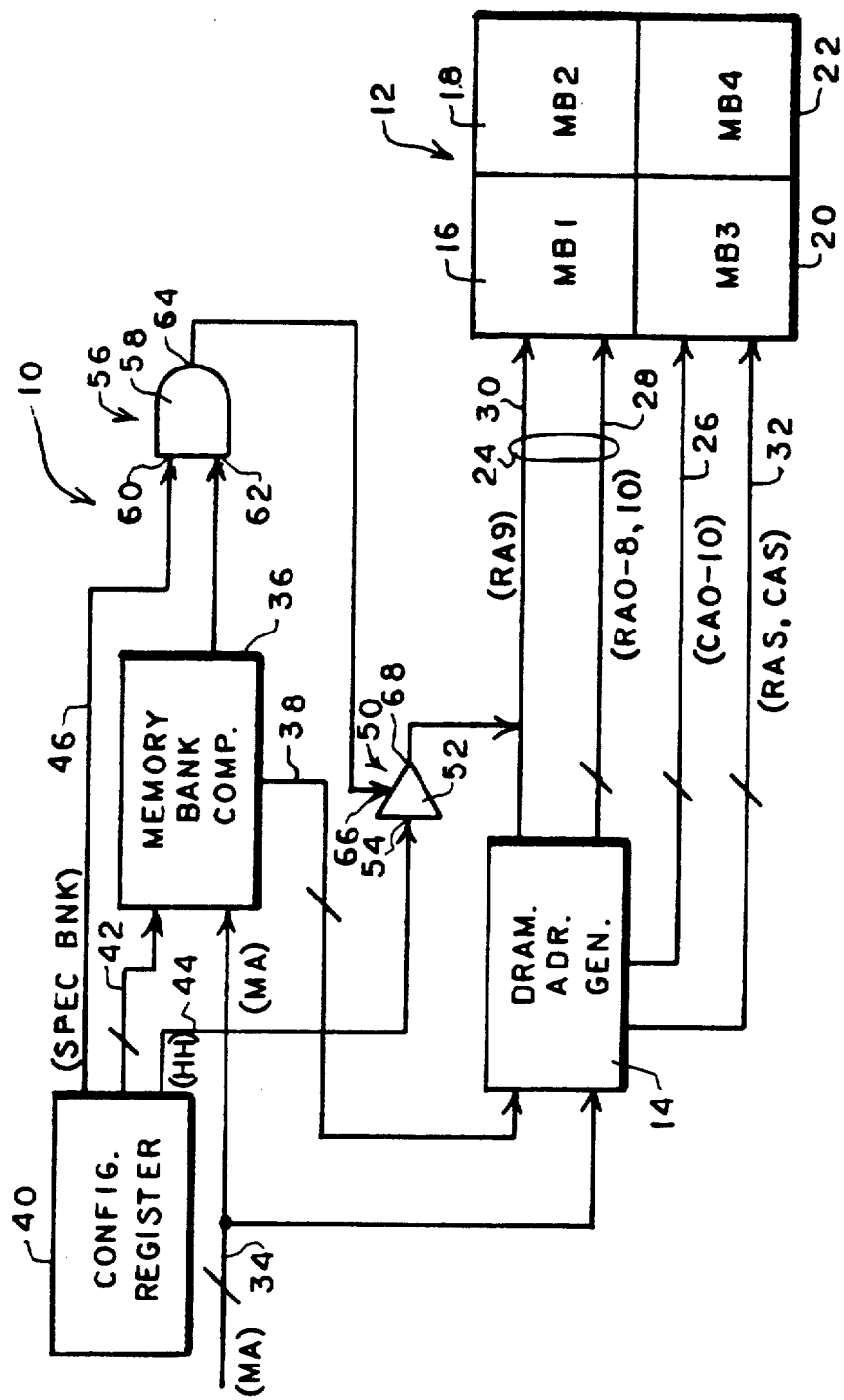

ROW ADDRESS GENERATOR FOR DEFECTIVE DRAMS INCLUDING AN UPPER AND LOWER MEMORY DEVICE

BACKGROUND OF THE INVENTION

The present invention generally relates to a row address generator for use in a memory system of the type incorporating a plurality of memory banks. The present invention more particularly relates to such an address generator, for use in a memory system including a plurality of dynamic random access memory banks and wherein one of the memory banks includes a memory device having an upper or lower half which is inoperative to assure that only the operative half of the memory device is addressed when its corresponding memory bank is accessed.

Memory systems are well known in the art. In applications where a large amount of memory space is required, such as in personal computer applications, memory systems may include more than one memory bank. Also, dynamic random access memories are extremely popular in such applications because of their extremely high memory density.

In a typical system, when a byte of data is to be stored, each memory bank is provided with the same memory address, first a row address, and then a column address. The particular memory location is selected with the application of first, a row address strobe signal and then a column strobe signal being applied to the proper memory bank. A write enable signal is then applied to each memory bank which is maintained as the byte of data is conveyed to each bank. Because only one bank is enabled to receive the row and column address, the byte of data is stored within its own unique storage location.

Dynamic random access memories are available in different types with each type corresponding to a respective different storage capacity. There are basically three different dynamic random access memory types, a 256KB type, a 1MB type, and a 4MB type. These different memory types afford flexibility to the ultimate user who may wish to tailor the storage size to a particular application or to increase the storage size of an existing system.

Each memory type requires a different type of access cycle. This is mainly due to the need for a different number of address bits for each type. For example, the 256KB type requires nine row and nine column address bits, the 1MB type requires ten row and ten column address bits, and the 4MB type requires eleven row and eleven column address bits.

Dynamic random access memories generally are divided in halves, an upper half and a lower half. Each half contains one-half of the total number of available storage locations. For example, in a 1MB type DRAM, the upper half will contain 512KB of memory space and the lower half will contain 512KB of memory space.

Often, defective dynamic random access memory devices will be fully operative in one half of the device and inoperative in the other half of the device. While only one half of a DRAM may be operative, it still can represent considerable memory space. For example, a 1MB DRAM which is operative only in the upper or lower half of the device can still provide 500KB of memory space. This is nearly twice as much memory space as is available in a 265KB memory.

Such defective DRAM's are commercially available and represent a considerable cost saving as compared to fully functional devices. Unfortunately, current memory systems are not able to accommodate such defective DRAM devices. More specifically, current memory systems are not able to assure that only the operative half of the defective device is addressed during accessing.

SUMMARY OF THE INVENTION

The present invention provides a row address generator for use in a memory system including a main address generator for generating row and column addresses for accessing a memory device, wherein the row and column addresses each include N bits, and wherein the memory device includes an upper half and a lower half with one of the halves being operative and the other half being inoperative. The row address generator is arranged to cause only the operative half of the memory device to be accessed and includes control means for providing a configuration control signal indicative of the half of the memory device which is operative and row address control means coupled to the control means and responsive to the configuration control signal and to the memory device being accessed for forcing the most-significant bit of the N-bit row address to a valid state in response to the control signal indicating the lower half of the memory device to be inoperative and for forcing the most-significant bit of the N-bit row address to an invalid state in response to the control signal indicating the upper half of the memory device to be inoperative to assure that only the operative half of the memory device is accessed.

The present invention further provides a row address generator for use in memory system of the type including a plurality of memory banks and a main address generator for generating row and column addresses for accessing the memory banks, wherein one of the memory banks includes a defective memory device addressable with N-row and N-column address bits, and wherein the defective device includes an upper half and a lower half, wherein one of the halves is operative and the other half is inoperative. The row address generator is arranged to cause only the operative half of the defective memory device to be addressed when its memory bank is accessed and includes configuration means for providing a first configuration control signal indicative of the half of the defective device which is operative and a second configuration control signal indicative of the presence of a defective device within a given one of the memory banks. The row address generator further includes memory access detect means responsive to the second configuration control signal for detecting when the given memory bank including the defective device is being accessed for providing an access control signal and row address control means responsive to the first configuration control signal and to the access control signal for forcing the most-significant bit of the N-bit row address to a valid state in response to the first configuration control signal indicating the upper half of the defective device to be operative and for forcing the most-significant bit of the N-bit row address to an invalid state in response to the first configuration control signal indicating the lower half of the defective device to be operative to assure that only the operative half of the defective device is accessed.

BRIEF DESCRIPTION OF THE DRAWING

The features of the present invention which are believed to be novel are set forth with particularity in the appended claims. The invention, together with further objects and advantages thereof, may best be understood by making reference to the following description taken in conjunction with the accompanying drawing, in the sole figure of which like reference numerals identify identical elements and wherein the sole figure is a block diagram of a row address generator embodying the present invention.

DETAILED DESCRIPTION OF THE PREFERRED EMBODIMENT

Referring now to the sole figure, it illustrates, in block diagram form, a row address generator 10 embodying the present invention. The row address generator 10 is adapted for use in a memory system of the type which includes an external memory 12 having a plurality of memory banks and a main address generator 14. The memory 12 may comprise a first memory bank 16, a second memory bank 18, a third memory bank 20 and a fourth memory bank 22. Each of the memory banks preferably includes dynamic random access memories. The memory 12 further includes first and second internal latches associated with each of the memory banks. A first latch 72 and a second latch 74 are shown associated with memory bank 16.

The dynamic random access memory devices utilized in the memory banks 16, 18, 20 and 22 may be of three different types, a 256KB, a 1MB type and a 4MB type. Such memory types are addressable by multiple-bit row and column addresses with the 256KB type being addressable by nine row and column address bits, the 1MB type being addressable by ten row and column address bits and the 4MB type being addressable by eleven row and column address bits. Such devices are also arranged in halves including an upper half and a lower half and wherein the lower half is addressed if the most-significant row address bit is a zero and the upper half is addressed if the most-significant row address bit is a one.

As previously mentioned, dynamic random access memory devices are commercially available which are defective in the sense that one of the device halves is operative and the other device half is inoperative. Such devices represent a considerable cost savings and still provide considerable memory space, especially in the case of the 1 MB and 4MB dynamic random access memory devices. For example, a defective 1MB dynamic random access memory device will still provide 512KB of memory space. In accordance with this preferred embodiment, the row address generator is arranged to accommodate such a defective 1MB DRAM within the first memory bank 16, as will be seen hereinafter, and assures that only the operative half of the 1MB DRAM is addressed when its memory bank is accessed. Of course, other types of DRAM devices may be accommodated, such as the 256KB type and the 4MB type, by implementing the present invention.

The memory banks 16, 18, 20 and 22 are addressable by the DRAM address generator 14. The DRAM address generator 14 may be of the type well known in the art and provides multiple-bit row addresses in parallel-bit format over a row address bus 24 and multiple-bit column addresses in parallel-bit format over a column address bus 26. Each of the buses is arranged to provide up to 11 address bits with the row address bus 24 providing address bits RA0 through RA10 and the column address bus 26 providing column address bits CA0 through CA10. By providing up to 11 row and column address bits, the DRAM address generator 14 is arranged to address all three types of DRAM devices including the 256KB type, the 1MB type and the 4MB type.

Each of the buses 24 and 26 includes a plurality of conductors with each conductor corresponding to a respective one of the address bits. The row address bus 24 is illustrated in two sections, a first section 28 for conducting the first nine address bits (RA0 through RA8) and the 11th address bit (RA10) and a second section 30 for conducting the 10th row address bit (RA9). The tenth row address bit (RA9) is the most-significant row address bit of the 1MB DRAM types.

The buses 24 and 26 are coupled to a multiplexer 70. The multiplexer 70 is provided to reduce pin count and is arranged to convey the row addresses to the internal latches and then the column addresses to the latches. Latch 72 provides the row addresses to memory bank 16 and latch 74 provides the column addresses to memory bank 16.

In accordance with conventional DRAM addressing, the DRAM address generator 14 also provides, over a multiple-bit bus 32 row address strobe signals and, over another multiple-bit bus 33, column address strobe signals. When the address generator 14 addresses a specific memory location within one of the memory banks, the multiplexer 70 provides the row addresses to each memory bank latch along with a row address strobe signal to the proper memory bank latch. Following the row address strobe signal and the multiple-bit row address, the multiplexer 70 conveys the column address to each memory bank latch along with a column address strobe signal to the proper memory bank latch. In this manner, the memory location corresponding to the row and column addresses is selected for storing a byte or word of data.

During each cycle of system operation, the address generator 14 generates the multiple-bit row and column addresses responsive to receiving a multiple-bit memory address over a multiple-bit bus 34. The memory address may be originated by a central processing unit (not shown). The address generator 14 is also responsive to control signals provided by a memory bank comparator 36 over another multiple-bit bus 38. The memory bank comparator 36 provides control signals indicative of the memory bank in which the byte of data is to be stored, if interleaving is possible and the type of interleaving which is possible, the type of memory bank in which the byte of data is to be stored and whether the memory address is a valid address, in other words, if there is an available storage location in one of the memory banks corresponding to the memory address. The memory bank comparator 36 provides its control signals over the bus 38 responsive to the memory address received over the bus 34 and configuration control signals provided by a configuration register 40. The configuration register 40 provides the memory bank comparator 36 over a multiple-bit bus 42 configuration bits which indicate the type of DRAM devices contained within the memory banks 12. This information is utilized by the memory bank comparator 36 to inform the address generator 14 of the type of DRAM device which is to be accessed for receiving a byte of data to in turn permit the address generator 14 to select the proper address cycle for generating the proper number of address bits for the multiple-bit row and column addresses. Preferably, the memory bank comparator 36 is of the type disclosed in co-pending U.S. Pat. application No. 07/575,957, filed on Aug. 31, 1990 in the name of James MacDonald for MEMORY BANK COMPARATOR SYSTEM, which application is assigned to the assignee of the present invention.

In accordance with the present invention, the configuration register 40 serves as a control or configuration means for providing a first configuration control signal indicative of which half of the defective device within the first memory bank 16 is operative over a line 44 and a second configuration control signal indicating the presence of a defective device within the first memory bank 16 over a line 46. In accordance with this preferred embodiment, the signal on line 46 will indicate that the defective device, referred to as a special bank (SPEC BNK) is within the first memory bank 16.

The first configuration control signal provided by the configuration register on line 44 is preferably a logical one when the upper half of the DRAM device is operative and the lower half is inoperative and a logical zero when the lower half of the defective DRAM device is operative and the upper half is inoperative. The first configuration control signal is conveyed to a row address control means 50 which comprises a tri-state buffer 52 at a first input 54 thereof.

The second configuration control signal provided on line 46 is conveyed to a memory access detect means 56 which is formed by an AND gate 58. AND gate 58 includes an input 60 which is coupled to line 46 for receiving the second configuration control signal and another input 62 which is coupled to the memory bank comparator 36. The memory bank comparator 36 provides the AND gate 58 at its input 62 with a logical one control signal when the first memory bank is being addressed. The AND gate 58 in response to receiving the signal from the memory bank comparator 36 indicating that the first memory bank is being addressed and in response to the second configuration control signal indicating that the first memory bank includes the defective DRAM device will provide at its output 64 an access control signal indicating that the memory bank which includes the defective DRAM device is being accessed.

The output 64 of AND gate 58 is coupled to the second input 66 of the tri-state buffer 52. The tri-state buffer 52 will provide at its output 68 in response to receiving a logical one at its input 66 the same logic output which is impressed upon its first input 54. When the second input 66 of the tri-state buffer 52 receives a logical zero, its output 68 will be an opened circuit. The output 68 of the tri-state buffer 52 is coupled to conductor 30 of the multiple-bit row address bus 24 which corresponds to the most-significant bit of the row address for a 1MB DRAM of the type which is defective and included within the first memory bank 16.

In operation, and in accordance with this preferred embodiment, it is assumed that the first memory bank 16 includes a defective 1MB DRAM device wherein the upper half is operative and the lower half is inoperative or wherein the lower half is operative and the upper half is inoperative. The configuration register 40 will provide a logical one on line 46 to the input 60 of AND gate 58 indicating that the first memory bank 16 includes such a defective DRAM device. When the first memory bank 16 is addressed, the memory bank comparator 36 provides a logical one to the input 62 of AND gate 58. Since inputs 60 and 62 of AND gate 58 are both at a logical one, the AND gate 58 will provide at its output 64 and impress upon the second input 66 of the tri-state buffer 52 a logical one indicating that the memory bank including the defective device is being accessed.

If the upper half of the defective DRAM device is operative and the lower half of the defective device is inoperative, the configuration register 40 will provide on line 44 a logical one to the first input 54 of the tri-state buffer 52. Since the tri-state buffer has a logical one on its second input 66 and a logical one on its first input 54, it will provide a valid state or a logical one at its output 68 to force the most-significant bit of the row address of the defective DRAM device to a logical one to cause only the operative upper half of the defective DRAM device to be accessed.

If the lower half of the defective DRAM device within the first memory bank 16 is operative and its upper half is inoperative, the configuration register 40 will provide over line 44 a logical zero. With a logical one on the second input 66 of the tri-state buffer 52 and a logical zero on the first input 54 of the tri-state buffer 52, the output 68 of the tri-state buffer 52 will force the most-significant bit of the multiple-bit row address of the defective DRAM device within the first memory bank 16 to an invalid state or a logical zero. As a result, this will also cause the operative half, and in this case the lower half, of the defective DRAM device within the first memory bank 16 to be accessed. Hence, if the upper half of the defective DRAM device is operative and the lower half is inoperative, the row address generator will force the most significant row address bit to a valid state (logical one) and if the lower half of the defective DRAM device is operative and the upper half inoperative, the row address generator will force the most-significant bit of the row address to an invalid state (logical zero).

From the foregoing, it can be seen that the present invention provides a row address generator which may be used in a memory system including a plurality of memory banks wherein one of the memory banks includes a defective memory device addressable with N-row and N-column address bits and wherein the defective device includes an upper half and a lower half with one of the halves being operative and the other half being inoperative to cause only the operative half of the defective memory device to be addressed when its memory bank is accessed. The row address generator forces the most-significant bit of the N-bit row address to a valid state when the upper half of the defective DRAM device is operative and the lower half inoperative and forces the most-significant bit of the N-bit row address to an invalid state when the lower half of the defective DRAM device is operative and the upper half is inoperative. This assures that only the operative half of the defective DRAM device is accessed. As a result, the row address generator of the present invention permits defective DRAM devices to be used within a memory system for providing considerable cost savings while still providing considerable memory space within a memory bank.

While a particular embodiment of the present invention has been shown and described, modifications may be made, and it is therefore intended to cover in the appended claims all such changes and modifications which fall within the true spirit and scope of the invention.

What is claimed is:

1. A row address generator for use in a memory system including a main address generator for generating row and column address for accessing a memory device in response to said memory system receiving a memory address, said row and column addresses each including N bits, and where in said memory device includes an upper half and a lower half, wherein one of said halves is operative and the other said half is inoperative, said row address generator being arranged to cause only said operative half of said memory device to be accessed; said row address generator comprising:

control means for generating a configuration control signal indicative of the half of said memory device which is operative; and row address control means coupled to said control means and responsive to said configuration control signal, coupled to said memory device being accessed, and coupled to receive said memory address and responsive to said memory address for forcing the most-significant bit of said N-bit row address to a valid state in response to said control signal indicating said lower half of said memory device to be inoperative and for forcing said most-significant bit of said N-bit row address to an invalid state in response to said control signal indicating said upper half of said memory device to be inoperative to assure that only said operative half of said memory device is accessed.

2. A row address generator as defined in claim 1 wherein said valid state is a logical one and wherein said invalid state is a logical zero.

3. A row address generator as defined in claim 1 wherein said row address control means is coupled to said main address generator for said forcing said most-significant row address bit to one of said valid state or said invalid state.

4. A row address generator as defined in claim 3 wherein said row address control means is coupled to the output of said main address generator.

5. A row address generator as defined in claim 4 wherein said memory system further includes a multiple-bit parallel row address bus coupled to the output of said main address generator, said bus including a plurality of conductors, each said conductor corresponding to a respective given one of said row address bits, and wherein said row address control means is coupled to said conductor of said bus corresponding to said most-significant bit of said row address bits.

6. A row address generator as defined in claim 5 further including memory access detect means for detecting when said memory device is being accessed, said memory access detect means being coupled to said control means and to said row address control means and providing said row address control means with an access control signal when said memory device is being accessed.

7. A row address generator as defined in claim 6 wherein said row address control means comprises a tri-state buffer having a first input for receiving said configuration control signal, a second input for receiving said access control signal, and an output coupled to said conductor of said bus corresponding to said most-significant bit of said row address bits.

8. A row address generator as defined in claim 6 wherein said control manes comprises a configuration register.

9. A row address generator as defined in claim 6 wherein said memory system includes a plurality of memory devices and wherein said row address control means is enabled only in response to said access control signal.

10. A row address generator as defined in claim 1 wherein said memory device comprises a 1MB dynamic random access memory, wherein said row address includes ten bits, and wherein said most-significant bit is the tenth bit.

11. A row address generator for use in a memory system of a type including a plurality of memory banks and a main address generator for generating row and column addresses for accessing said memory banks in response to said memory system receiving a memory address, wherein one of said memory banks includes a defective memory device addressable with N row and N column address bits and wherein said defective device includes an upper half and a lower half, wherein one of said halves is operative and the other said half is inoperative, said row address generator being arranged to cause only said operative half of said defective memory device to be addressed when its memory bank is accessed; said row address generator comprising:

configuration means for providing a first configuration control signal indicative of the half of said defective device which is operative and a second configuration control signal indicative of the presence of said defective device within a given memory bank;

memory access detect means responsive to said second configuration control signal and to said memory address for detecting when said given memory bank, including said defective device, is being accessed for generating an access control signal; and row address control means responsive to said first configuration control signal and to said access control signal for forcing the most-significant bit of said N-bit row address to a valid state in response to said first configuration control signal indicating said upper half of said defective device to be operative and for forcing said most-significant bit of said N-bit row address to an invalid state in response to said first configuration control signal indicating said lower half of said defective device to be operative to assure that only said operative half of said defective device is accessed.

12. A row address generator as defined in claim 11 wherein said valid state is a logical one and wherein said invalid state is a logical zero.

13. A row address generator as defined in claim 11 wherein said row address control means is coupled to said main address generator for said forcing said most-significant row address bit to one of said valid state or said invalid state.

14. A row address generator as defined in claim 13 wherein said row address control means is coupled to the output of said main address generator.

15. A row address generator as defined in claim 14 wherein said memory system further includes a multiple-bit parallel row address bus coupled to the output of said main address generator, said bus including a plurality of conductors, each said conductor corresponding to a respective given one of said row address bits, and wherein said row address control means is coupled to said conductor of said bus corresponding to said most-significant bit of said N-row address bits.

16. A row address generator as defined in claim 15 wherein said row address control means comprises a tri-state buffer having a first input for receiving said first configuration control signal, a second input for receiving said access control signal, and an output coupled to said conductor of said bus corresponding to said most-significant bit of said N-row address bits.

17. A row address generator as defined in claim 15 wherein said configuration means comprises a storage register.

18. A row address generator as defined in claim 11 wherein said defective memory device comprises a 1MB dynamic random access memory, wherein said row address includes ten bits, and wherein said most-significant bit is the tenth bit.

* * * * *